United States Patent
Lee et al.

(10) Patent No.: US 9,867,267 B2
(45) Date of Patent: Jan. 9, 2018

(54) EXTREME ULTRAVIOLET LIGHT SOURCE DEVICE

(71) Applicants: Seung-Koo Lee, Seoul (KR); In-Sung Kim, Seongnam-si (KR); Jin-Hong Park, Yongin-si (KR)

(72) Inventors: Seung-Koo Lee, Seoul (KR); In-Sung Kim, Seongnam-si (KR); Jin-Hong Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 177 days.

(21) Appl. No.: 14/817,762

(22) Filed: Aug. 4, 2015

(65) Prior Publication Data
US 2016/0143121 A1 May 19, 2016

(30) Foreign Application Priority Data
Nov. 17, 2014 (KR) .................. 10-2014-0160099

(51) Int. Cl.
| | | |
|---|---|---|
| *H05G 2/00* | (2006.01) | |
| *G01V 8/12* | (2006.01) | |
| *G21K 1/06* | (2006.01) | |
| *G03F 7/20* | (2006.01) | |
| *B05B 17/06* | (2006.01) | |

(52) U.S. Cl.
CPC ............ *H05G 2/006* (2013.01); *B05B 17/06* (2013.01); *G01V 8/12* (2013.01); *G03F 7/70033* (2013.01); *G21K 1/067* (2013.01); *H05G 2/003* (2013.01); *H05G 2/008* (2013.01)

(58) Field of Classification Search
CPC ........ H05G 2/005; H05G 2/008; H05G 2/003; H05G 2/006; G03F 7/70033
USPC ........................................ 250/504 R
See application file for complete search history.

(56) References Cited

U.S. PATENT DOCUMENTS

| | | | |
|---|---|---|---|
| 8,704,200 B2 | 4/2014 | Bykanov et al. | |
| 2003/0062403 A1 | 4/2003 | Orme-Marmerelis et al. | |
| 2006/0176925 A1 | 8/2006 | Nakano | |
| 2007/0170377 A1 | 7/2007 | Nakano | |
| 2010/0258748 A1 | 10/2010 | Vaschenko et al. | |
| 2013/0186976 A1* | 7/2013 | Ishihara | B05B 17/06 239/102.1 |

(Continued)

FOREIGN PATENT DOCUMENTS

| | | |
|---|---|---|
| JP | 2006-216801 | 8/2006 |
| JP | 2012-146682 | 4/2012 |

(Continued)

*Primary Examiner* — Thanh Luu
(74) *Attorney, Agent, or Firm* — Myers Bigel, P.A.

(57) ABSTRACT

An extreme ultraviolet (EUV) light source device includes a source droplet generator for generating source droplets as a target source for generating extreme ultraviolet (EUV) light and for injecting the source droplets to a collector, a light irradiator for directing a detection light to an injection path of the source droplets, a light detector for detecting the detection light blocked by the source droplet, and a source droplet controller electrically connected to the light detector and the source droplet generator for analyzing the detection light to determine whether a satellite of the source droplet is generated or to determine a size of the generated satellite and for controlling a formation of a stream of source droplets based on the determination result.

20 Claims, 5 Drawing Sheets

(56) References Cited

U.S. PATENT DOCUMENTS

2014/0098830 A1  4/2014  Yabu et al.
2014/0145096 A1  5/2014  Partlo et al.

FOREIGN PATENT DOCUMENTS

| JP | 2013-175434 | 11/2012 |
| JP | 2014-078394 | 5/2014 |
| KR | 1020100073098 | 7/2010 |

* cited by examiner

EXTREME ULTRAVIOLET LIGHT SOURCE DEVICE

RELATED APPLICATIONS

This application claims priority under 35 U.S.C. §119 to Korean Patent Application No. 10-2014-0160099, filed on Nov. 17, 2014, the contents of which are herein incorporated by reference in their entirety.

BACKGROUND

Example embodiments relate to an extreme ultraviolet (EUV) light source device and a method of generating EUV light. More particularly, example embodiments relate to an EUV light source device using laser produced plasma (LPP) and a method of generating EUV light using the same.

In the manufacture of a semiconductor device, extreme ultraviolet (EUV) light is advantageously adopted as a light source in EUV lithography. A laser produced plasma (LPP) source may irradiate a target source having one or more emission rays in the EUV range, e.g., xenon, lithium or tin, with a laser light to emit EUV light by an interaction with the target source and the laser light. For example, a source droplet as the target source may be injected into a collector such as a reflector, and then irradiated with a $CO_2$ laser light to produce plasma. The resulting plasma may emit output radiation, e.g., EUV radiation.

However, during the process of operating in the EUV light source device, when a satellite occurs in or near the source droplet, it may be difficult to generate EUV light having uniform intensity, and the collector may be contaminated. Accordingly, it is desirable for these satellites to be effectively monitored and removed.

SUMMARY

Example embodiments provide an extreme ultraviolet light source device ionizer capable of monitoring source droplets supplied to a collector.

Example embodiments provide a method of generating an extreme ultraviolet light using the extreme ultraviolet light source device.

According to example embodiments, an extreme ultraviolet (EUV) light source device includes a source droplet generator configured to generate source droplets as a target source for generating extreme ultraviolet (EUV) light and configured to inject the source droplets into or to a collector, a light irradiator configured to direct a detection light to an injection path of the source droplets, a light detector configured to detect the detection light blocked by a respective source droplet, and a source droplet controller electrically connected to the light detector and the source droplet generator and configured to: analyze the detection light to determine whether a satellite of the source droplet is generated or to determine a size of the generated satellite; and control a formation of a stream of source droplets based on the determination result.

In example embodiments, the light detector may be configured to generate a light signal wave from a signal of the detection light blocked by the source droplet.

In example embodiments, the light detector may include a photodiode.

In example embodiments, the source droplet controller may include a signal analyzer configured to analyze a light signal wave of the detection light to generate a control signal, and a driving controller configured to provide the control signal to the source droplet generator.

In example embodiments, the signal analyzer may be configured to compare the light signal wave with a reference wave.

In example embodiments, the signal analyzer may include an integrator configured to integrate the light signal wave to provide an integrated value and a differentiator configured to compare the integrated value and a reference value of the reference wave.

In example embodiments, the signal analyzer may be configured to analyze a width of the detected light signal wave to determine a size of the source droplet.

In example embodiments, the width of the detected light signal wave may be the full width at half maximum of the light signal wave.

In example embodiments, the source droplet generator may include a fuel supply configured to supply a liquid fuel, a nozzle connected to the fuel supply through a fuel supply line and configured to eject source droplets, and an actuator configured to oscillate the fuel supply line at an oscillatory frequency to form a stream of the source droplets ejected from the nozzle.

In example embodiments, the source droplet controller may be configured to generate a control signal that may include control values with respect to an oscillation frequency, a gain value or an uptime related with forming conditions of the source droplets.

According to example embodiments, an extreme ultraviolet (EUV) light source device includes a collector configured to collect and reflect extreme ultraviolet (EUV) light, a source droplet generator configured to generate source droplets and to inject the source droplets into or to the collector, a light irradiator configured to direct a detection light to an injection path of the source droplets, a light detector configured to detect the detection light blocked by a respective source droplet, a drive laser configured to irradiate the source droplet injected into or to the collector with a laser light to generate the EUV light, and a source droplet controller electrically connected to the light detector and the source droplet generator and configured to: analyze the detection light to determine whether a satellite of the source droplet is generated and, if so, to determine a size of the generated satellite; and control a formation of a stream of source droplets based on the determination result.

In example embodiments, the light detector may be configured to generate a light signal wave from a signal of the detection light blocked by the source droplet.

In example embodiments, the source droplet controller may include a signal analyzer that may be configured to compare the light signal wave with a reference wave.

In example embodiments, the signal analyzer may include an integrator configured to integrate the light signal wave to provide an integrated value and a differentiator configured to compare the integrated value and a reference value of the reference wave.

In example embodiments, the signal analyzer may be configured to analyze a width of a detected light signal wave to determine a size of the source droplet.

In example embodiments, the width of the detected light signal wave may be the full width at half maximum of the light signal wave.

In example embodiments, the source droplet generator may include a fuel supply configured to supply a liquid fuel, a nozzle connected to the fuel supply through a fuel supply line and configured to eject source droplets, and an actuator configured to oscillate the fuel supply line at an oscillatory frequency to form a stream of the source droplets ejected from the nozzle.

In example embodiments, the source droplet controller may be configured to generate a control signal that may include control values with respect to an oscillation frequency, a gain value or an uptime related with forming conditions of the source droplets.

In example embodiments, the source droplet may include at least one element of xenon, lithium and tin.

In example embodiments, the collector may include an elliptical reflection surface having a first focus position within or near an irradiation site to which the laser light is focused.

According to example embodiments, in a method of generating extreme ultraviolet (EUV) light, a light scattered from source droplets which are provided as a target source for generating extreme ultraviolet (EUV) light is detected to obtain a light signal wave. The light signal wave is analyzed to determine whether a satellite of the source droplet occurs and, if so, to determine a size of the generated satellite and to generate a control signal based on the determination. Controlled source droplets are generated according to the control signal.

In example embodiments, detecting the light scattered from the source droplets to obtain the light signal wave may include generating and injecting the source droplets into or to a collector, irradiating a respective source droplet on an injection path with a detection light, and detecting the light blocked by the source droplet.

In example embodiments, detecting the light blocked by the source droplet may be performed by a photodiode.

In example embodiments, analyzing the light signal wave may include comparing the light signal wave with a predetermined reference signal.

In example embodiments, analyzing the light signal wave may include analyzing a width of the light signal wave to determine a size of the source droplet.

In example embodiments, generating the controlled source droplets according to the control signal may include adjusting an oscillation frequency, a gain value or an uptime related with forming conditions of the source droplets according to the control signal.

In example embodiments, the source droplet comprises at least one element of xenon, lithium and tin.

In example embodiments, the method may further include irradiating the supplied source droplet with a laser light to generate EUV light.

According to example embodiments, a method of generating extreme ultraviolet (EUV) light includes: injecting target source droplets for generating extreme ultraviolet (EUV) light along an injection path to a collector; directing a detection light toward the injection path of the source droplets; detecting the detection light including that blocked by a respective source droplet; analyzing the detection light to determine a size of a satellite associated with the source droplet; and controlling the injection of the target source droplets in response to determining the size of the satellite associated with the source droplet.

In example embodiments, analyzing the detection light may include analyzing a detected light signal wave of the detection light and comparing the detected light signal wave with a reference wave.

In example embodiments, analyzing the detection light may include integrating the detected light signal wave to provide an integrated value and comparing the integrated value and a reference value of the reference wave.

In example embodiments, analyzing the detection light may include analyzing a width of the detected light signal wave to determine a size of the source droplet.

In example embodiments, the width of the detected light signal wave may be the full width at half maximum of the light signal wave.

In example embodiments, injecting target source droplets may include injecting the target source droplets from a nozzle connected to a fuel supply through a fuel supply line, and controlling the injection of the target source droplets may include oscillating the fuel supply line at an oscillatory frequency.

In example embodiments, the method may include irradiating the injected target source droplets with a laser light to generate EUV light.

According to example embodiments, source droplets which are generated and provided from a source droplet generator may be monitored in real time to determine whether a satellite of the source droplet is generated or a size of the generated satellite and to adjust conditions of forming source droplets based on the determination results and generate stable source droplets having a desired frequency.

Accordingly, a collector may be inhibited or prevented from being contaminated by non-uniformity of the source concentration due to the satellite, and source droplets having a uniform size distribution may be generated and provided consistently.

BRIEF DESCRIPTION OF THE DRAWINGS

Example embodiments will be more clearly understood from the following detailed description taken in conjunction with the accompanying drawings.

FIG. 1 is a block diagram illustrating a plan view of an extreme ultraviolet (EUV) light source device in accordance with example embodiments.

FIG. 2 is a block diagram illustrating a stream of source droplets generated from a source droplet generator in the EUV light source device in FIG. 1.

FIG. 3 is a block diagram illustrating a signal analyzer of the EUV light source device in FIG. 1.

FIG. 4 is a flowchart illustrating a method of generating EUV light in accordance with example embodiments.

FIG. 5 is a graph illustrating light signal waves detected from source droplets provided as a target source.

FIG. 6 is a schematic diagram illustrating a satellite generated in a source droplet.

FIG. 7 is a graph illustrating a light signal wave detected from the source droplets having the satellites in FIG. 6.

FIG. 8 is a graph illustrating light signal waves detected from source droplets having different sizes.

DETAILED DESCRIPTION OF EXAMPLE EMBODIMENTS

Figure 1:
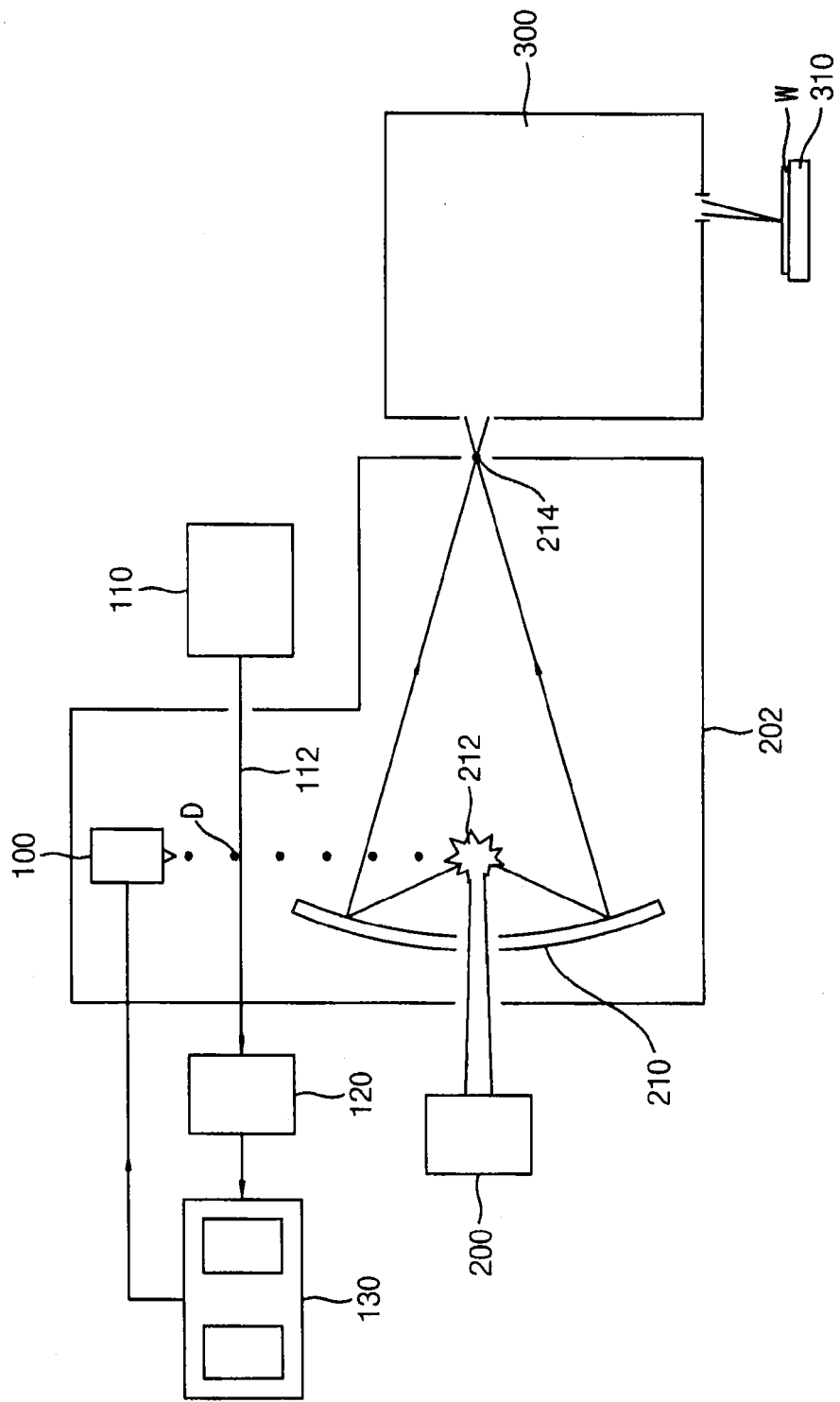
FIGS. 1 to 8 represent non-limiting, example embodiments as described herein.

Various example embodiments will be described more fully hereinafter with reference to the accompanying drawings, in which example embodiments are shown. The inventive concept may, however, be embodied in many different forms and should not be construed as limited to example embodiments set forth herein. Rather, these example embodiments are provided so that this disclosure will be thorough and complete, and will fully convey the scope of the inventive concept to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
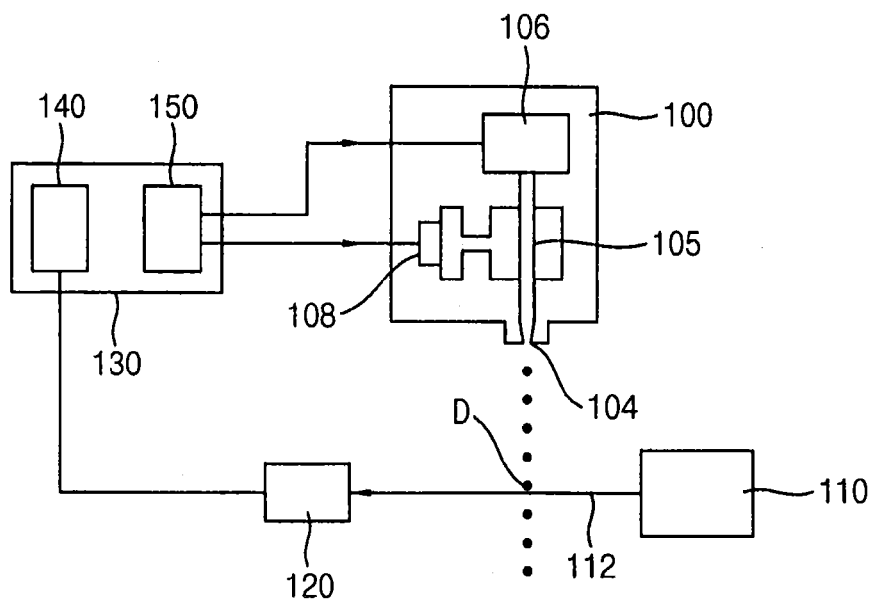
Figure 3:
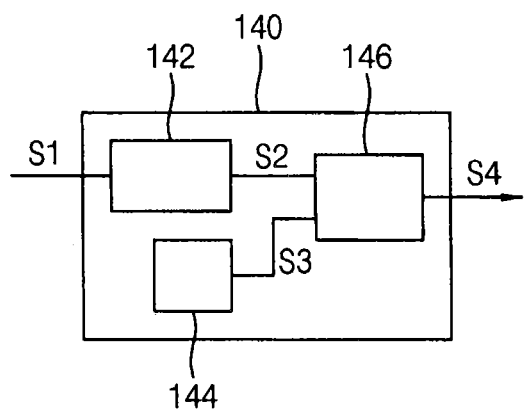

FIG. 1 is a block diagram (plan view) illustrating an extreme ultraviolet (EUV) light source device in accordance with example embodiments. FIG. 2 illustrates a stream of source droplets generated from a source droplet generator in the EUV light source device in FIG. 1. FIG. 3 is a block diagram illustrating a signal analyzer of the EUV light source device in FIG. 1.

Referring to FIGS. 1 to 3, an EUV light source device may include a collector 210 for collecting and reflecting extreme ultraviolet (EUV) light, a source droplet generator 100 for generating and delivering source droplets into or to the collector 210, a light irradiator 110 for directing a detection light to the injection path of the source droplet, a light detector 120 for detecting the detection light blocked out and scattered by the source droplet, a drive laser 200 for directing a laser light to the source droplet injected into or to the collector 210 to generate EUV light, and a source droplet controller 130 connected (e.g., electrically connected) to the light detector 120 and the source droplet generator 100 for analyzing the detection light to determine whether a satellite of the source droplet is generated or to determine a size of the generated satellite and for controlling a formation of a stream of source droplets based on the determination results.

In example embodiments, the EUV light source device may generate and provide the EUV light for a wafer exposure apparatus 300 of a lithography apparatus. The EUV light reflected by the collector 210 may be adjusted and directed by an illumination system to be incident on a mask, and then, a pattern image of the mask may be projected onto a target portion of a wafer W by a projection system. The wafer 300 may be held on a stage 310 or the like.

The source droplet generator 100 may generate source droplets as a target source for generating extreme ultraviolet light. The source droplet generator 100 may inject source droplets at a predetermined period or rate into or to the collector 210 through a nozzle 104 (FIG. 2). For example, the source droplet may include at least one element, e.g., xenon, lithium or tin, with one or more emission rays in the EUV range.

As illustrated in FIG. 2, the source droplet generator 100 may include a fuel supply 106 for supplying a liquid fuel, the nozzle 104 connected to the fuel supply through a fuel supply line 105 for ejecting source droplets, and an actuator 108 for oscillating the fuel supply line 105 at an oscillatory frequency to modulate a pressure inside the fuel supply line 105, to thereby control a formation of a stream of source droplets ejected from the nozzle 104.

The liquid fuel may be fed from the fuel supply 106 to the nozzle 104 through the fuel supply line 105 by a pumping device. The natural break-up of a stream of liquid ejecting from the nozzle 104, known as Rayleigh break-up, may form a stream of source droplets. The Rayleigh frequency, which corresponds to the rate of droplet production of the nozzle 104, may be related to the mean velocity of the fuel at the nozzle and the diameter of the nozzle.

The actuator 108 may be used to control the Rayleigh break-up by modulating or oscillating the pressure of the liquid fuel at the nozzle 104. The actuator 108 may include a piezoelectric actuator. The pressure inside the nozzle 104 may be modulated to control the exit velocity of the source droplets from the nozzle, a distance between the source droplets, etc. For example, the distance between the source droplets may be increased with decreasing oscillation frequency, while the distance between the source droplets may be decreased with increasing oscillation frequency.

In example embodiments, the EUV light source device may include a source droplet detector or source droplet detection device for monitoring the source droplets generated from the source droplet generator 100. The source droplet detector may include the light irradiator 110 for directing a detection light 112 into or to the injection path of the source droplet and the light detector 120 for detecting the detection light 112 that is blocked out and/or scattered by the source droplet.

The light detector 120 may output an electrical signal representing a change in an amount of the detection light 112 blocked by the source droplet to the controller 130. For example, the light detector 120 may include a photodiode which receives and converts the detecting light scattered by the source droplet into the electrical signal. The electrical signal generated by the stream of the source droplets may be represented as a light signal wave versus time.

As illustrated in FIGS. 2 and 3, the source droplet controller 130 may analyze the detection light to determine whether a satellite of the source droplet is generated or to determine a size of the generated satellite and control a formation of a stream of source droplets based on the determination results. The source droplet controller 130 may include a signal analyzer 140 for analyzing the light signal wave to generate a control signal and a driving controller 150 for providing the control signal to the source droplet generator 100.

The signal analyzer 140 may compare the detected light signal wave with a predetermined reference wave to determine whether or not a satellite of the source droplet is generated. For example, the signal analyzer 140 may include an integrator 142 for integrating the detected light signal wave, a reference wave output device or portion 144 for outputting a reference wave determined by a user, and a differentiator 146 for comparing the light signal wave and the reference wave. The integrator 142 may integrate an electrical signal S1 of the detected source droplet and output an integrated value S2. The differentiator 146 may compare the integrated value S2 with an integrated value S3 of the reference wave form and output a control signal S4.

The signal analyzer 140 may analyze a width of the detected light signal wave to determine a size of the source droplet. For example, the full width at half maximum of the light signal wave may be detected to determine the size of the source droplet.

The source droplet controller 130 may be connected (e.g., electrically connected) to the source droplet generator 100. The driving controller 150 of the source droplet controller 130 may monitor the source droplets which are ejected from the nozzle 104 of the source droplet generator 100 and output the control signal to the source droplet generator 100, thereby controlling formation of source droplets.

For example, the driving controller 150 may be connected (e.g., electrically connected) to the pumping device of the fuel supply and the actuator 108 of the source droplet generator 100 to provide the control signals thereto. The control signal may include control values with respect to an oscillation frequency, a gain value or an uptime related with forming conditions of the source droplets. Accordingly, the source droplet generator 100 may receive the control signal to generate source droplets having a desired frequency, velocity, size, etc. and provide the source droplets into or to the collector 210.

The drive laser 200 may irradiate the source droplet with a laser light at an irradiation site 212 in a chamber 202. The drive laser 200 may direct the laser light to the source droplet D injected into or to the collector 210 to generate EUV light. The drive laser 200 may generate a $CO_2$ laser light and then the generated laser light may be focused to the irradiation site through a steering system. The laser light may react with and vaporize the source droplet to produce plasma. The resulting plasma may emit output radiation, e.g., EUV radiation.

The collector 210 may include an elliptical reflection surface having a first focus position within or near the irradiation site 212 to which the laser light is focused. The collector 210 may collect, reflect and focus the EUV light to a second focus position 214. And then, the EUV light may be delivered to the illumination system of the wafer exposure apparatus 300.

In example embodiments, the EUV light source device may further include a preliminary laser for preheating the source droplet. The preliminary laser may preheat the source droplet before the laser light is irradiated by the drive laser 200. The drive laser 200 and the preliminary laser may be referred to as a dual laser pulsing (DLP) source.

As mentioned above, the source droplets which are generated and provided from the source droplet generator 100 may be monitored in real time to determine whether a satellite of the source droplet is generated or a size of the generated satellite and to adjust conditions of forming source droplets based on the determination results and generate source droplets having a desired frequency and a stable state.

Accordingly, the collector 210 may be inhibited or prevented from being contaminated by non-uniformity of the source concentration due to the satellite, and source droplets having a uniform size distribution may be generated and provided consistently.

Hereinafter, a method of generating extreme ultraviolet light using the EUV light source device will be explained.

Figure 4:
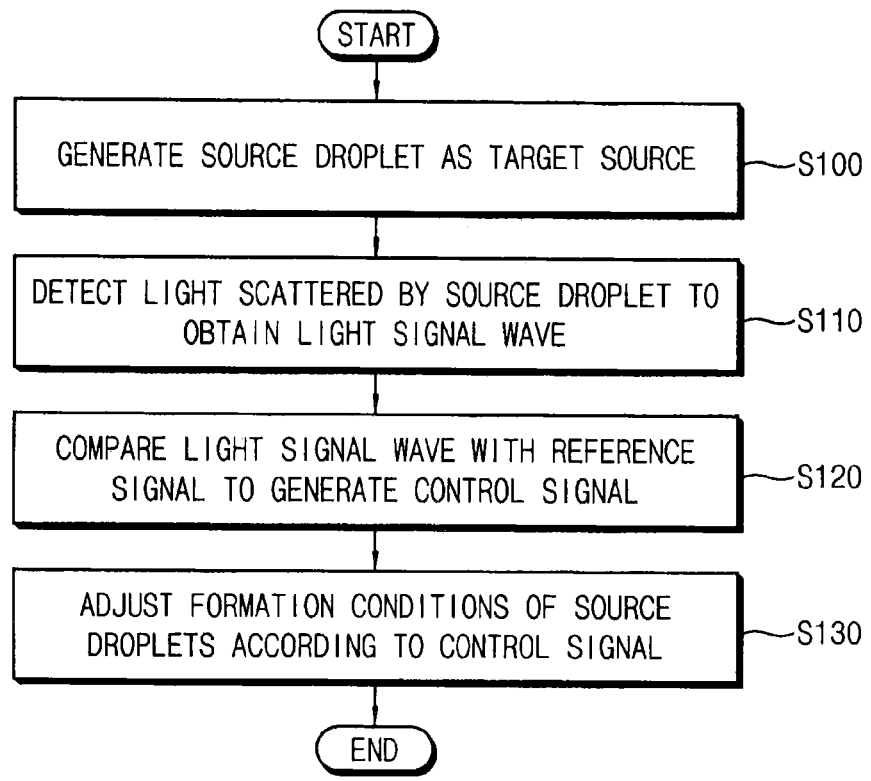
Figure 5:
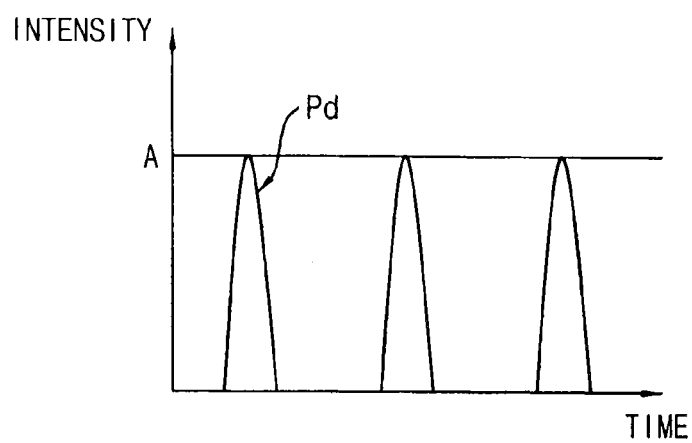
Figure 6:
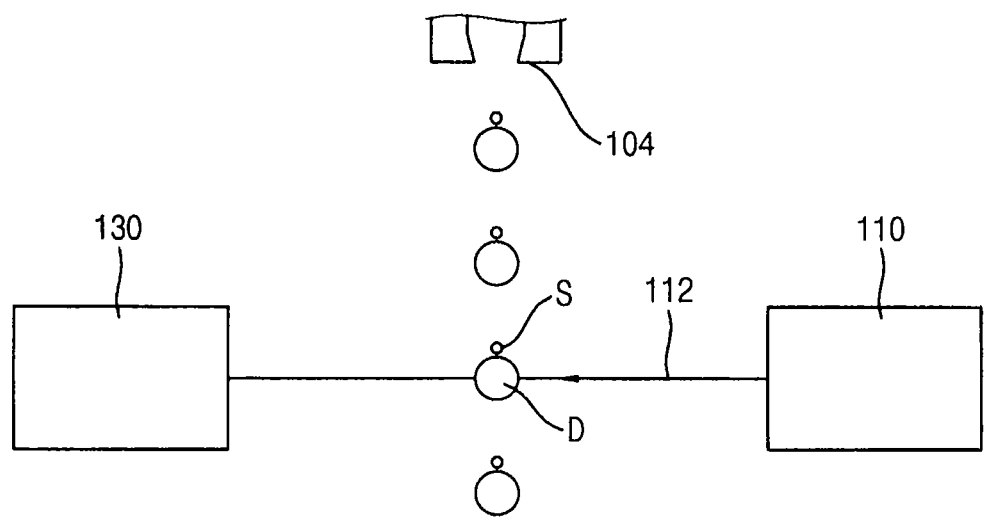
Figure 7:
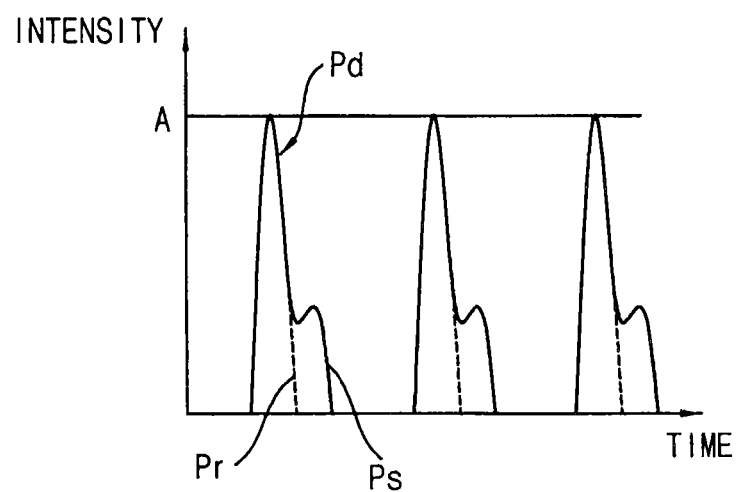
Figure 8:
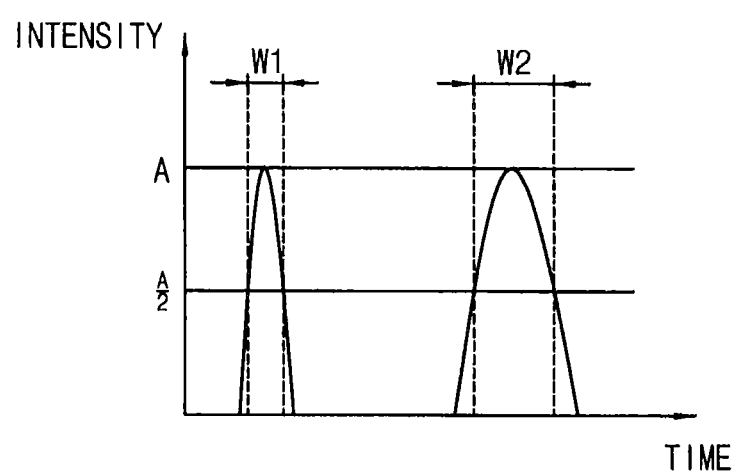

FIG. 4 is a flowchart illustrating a method of generating EUV light in accordance with example embodiments. FIG. 5 is a graph illustrating light signal waves detected from source droplets provided as a target source. FIG. 6 illustrates a satellite generated in a source droplet. FIG. 7 is a graph illustrating a light signal wave detected from the source droplets having the satellites in FIG. 6. FIG. 8 is a graph illustrating light signal waves detected from source droplets having different sizes.

Referring to FIGS. 1 to 8, source droplets may be generated and provided as a target source for generating extreme ultraviolet light (S100), and a light scattered from the source droplets may be detected to obtain a light signal wave (S110).

In example embodiments, source droplets D may be generated as a target source for generating extreme ultraviolet light using a source droplet generator 100. The source droplets generated by the source droplet generator 100 may be supplied along an injection path at a predetermined period or rate into or to a collector 210 through a nozzle 104. For example, the source droplet may include at least one element, e.g., xenon, lithium or tin, with one or more emission rays in the EUV range.

The exit velocity of the source droplet from the nozzle 104, a distance between the source droplets, etc. may be adjusted by modulating a pressure inside the nozzle 104. The pressure inside the nozzle 104 may be modulated by a pumping device of a fuel supply 106 or an actuator 108 applying an oscillating frequency.

Then, a detection light 112 may be irradiated to the injection path of the source droplet and the detection light 112 blocked out and scattered by a stream of the source droplets to be supplied to the collector 210 may be detected.

A light detector 120 may be used to produce an electrical signal representing a change in an amount of the detection light 112 blocked by the source droplet. For example, the light detector 120 may include a photodiode which receives and converts the detecting light scattered by the source droplet into the electrical signal.

As illustrated in FIG. 5, the electrical signal for the stream of the source droplets may be represented as a light signal wave Pd versus time. The light signal wave Pd may have a frequency representing a distance between the source droplets. The light signal wave Pd may have amplitude representing a size of the source droplet.

As illustrated in FIGS. 6 and 7, during the process of operating the source droplet generator 100, a satellite S may occur in or near the source droplet D. The satellite may result in a non-uniform dose of the source droplet or a contamination of the collector 210. In FIG. 7, a light signal wave Pd for the source droplets having the satellite is illustrated.

Then, the light signal wave may be compared with a reference wave to generate a control signal (S120). The light signal wave may be analyzed to determine whether a satellite of the source droplet is generated or to determine a size of the generated satellite and to generate a control signal. In addition, a width of the light signal wave may be analyzed to determine a size of the source droplet.

In example embodiments, as illustrated in FIG. 7, the detected light signal wave Pd may be compared with a predetermined reference signal wave Pr to determine whether or not a satellite of the source droplet is generated.

First, a user may preset and operate the source droplet generator 100 to generate a stream of source droplets having a desired shape. A light signal wave obtained by the initially generated source droplets may be selected as a reference signal wave Pr.

During the process of operating in the source droplet generator, when a satellite may occur in or near the source droplet, the light signal wave Pd obtained by the source droplets having a satellite may have a sideband portion Ps. The signal analyzer 140 may compare the light signal wave with the reference signal wave Pr to generate a control signal according to a difference value generated by the sideband portion Ps. The control signal may have a control value of an oscillation frequency, a gain value or an uptime related with forming conditions of the source droplets, which inhibits or prevents a satellite from occurring in the source droplet.

In example embodiments, as illustrated in FIG. 8, a width of the detected light signal wave may be analyzed to determine a size of the source droplet. For example, the full width at half maximum of the light signal wave may be detected to determine the size of the source droplet. When a light signal wave for a first source droplet has a first half width W1 and a light signal wave for a second source droplet has a second half width W2 greater than the first half width W1, it may be determined that a size of the second source droplet may be greater than a size of the first source droplet.

Then, conditions of forming source droplets may be adjusted according to the control signal (S130).

The source droplet generator 100 may be controlled according to the control signal to remove the satellite and to generate a stream of source droplets having a desired size. The control signal may include a control value of an oscillation frequency, a gain value or an uptime related to forming conditions of the source droplets. Accordingly, the source droplet generator 100 may receive the control signal to generate source droplets having a desired frequency, velocity, size, etc. and provide the source droplets into or to the collector 210.

Then, the source droplet D injected into or to the collector 210 may be irradiated with a laser light to generate EUV light.

A drive laser 200 may generate a $CO_2$ laser light and then the generated laser light may be focused to the irradiation site 212 through a steering system. The laser light may react with and vaporize the source droplet to produce plasma. The resulting plasma may emit output radiation, e.g., EUV radiation.

The collector 210 may include an elliptical reflection surface having a first focus position within or near the irradiation site 212 to which the laser light is focused. The collector 210 may collect, reflect and focus the EUV light to a second focus position 214. And then, the EUV light may be delivered to the illumination system of the wafer exposure apparatus 300.

As mentioned above, the source droplets which are generated and provided from the source droplet generator 100 may be monitored in real time to determine whether a satellite of the source droplet is generated or a size of the generated satellite and to adjust conditions of forming source droplets based on the determination results and generate source droplets having a desired frequency and a stable state.

Accordingly, the collector may be inhibited or prevented from being contaminated by non-uniformity of the source concentration due to the satellite, and source droplets having a uniform size distribution may be generated and provided consistently.

A semiconductor device such as DRAM, VNAND formed using the systems and methods described herein may be applied to computing systems. The computing system may be used for a computer, portable computer, laptop computer, personal digital assistant, tablet, mobile phone, MP3 player, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concept. Accordingly, all such modifications are intended to be included within the scope of the inventive concept as defined in the claims.

What is claimed is:

1. An extreme ultraviolet (EUV) light source device, comprising:
   a source droplet generator configured to generate source droplets as a target source for generating extreme ultraviolet (EUV) light and configured to inject the source droplets to a collector;
   a light irradiator configured to direct a detection light to an injection path of the source droplets;
   a light detector configured to detect the detection light blocked by a respective source droplet; and
   a source droplet controller connected to the light detector and the source droplet generator and configured to:
      analyze the detection light to determine whether a satellite of the source droplet is generated or to determine a size of the generated satellite; and
      control a formation of a stream of source droplets based on the determination of whether a satellite of the source droplet is generated or based on the determination of a size of the generated satellite,
   wherein the source droplet controller comprises:
      a signal analyzer configured to analyze a light signal wave of the detection light to generate a control signal; and
      a driving controller configured to provide the control signal to the source droplet generator,
   wherein the signal analyzer is configured to compare the light signal wave with a reference wave.

2. The EUV light source device of claim 1, wherein the light detector is configured to generate the light signal wave from a signal of the detection light blocked by the source droplet.

3. The EUV light source device of claim 1, wherein the light detector comprises a photodiode.

4. The EUV light source device of claim 1, wherein the signal analyzer comprises an integrator configured to integrate the light signal wave to provide an integrated value and a differentiator configured to compare the integrated value and a reference value of the reference wave.

5. The EUV light source device of claim 1, wherein the source droplet generator comprises:
a fuel supply configured to supply a liquid fuel;
a nozzle connected to the fuel supply through a fuel supply line and configured to eject source droplets; and
an actuator configured to oscillate the fuel supply line at an oscillatory frequency to form the stream of source droplets ejected from the nozzle.

6. The EUV light source device of claim 1, wherein the source droplet controller is configured to generate a control signal comprising control values with respect to an oscillation frequency, a gain value or an uptime related to forming conditions of the source droplets.

7. An extreme ultraviolet (EUV) light source device, comprising:
a source droplet generator configured to generate source droplets as a target source for generating extreme ultraviolet (EUV) light and configured to inject the source droplets to a collector;
a light irradiator configured to direct a detection light to an injection path of the source droplets;
a light detector configured to detect the detection light blocked by a respective source droplet; and
a source droplet controller connected to the light detector and the source droplet generator and configured to:
analyze the detection light to determine whether a satellite of the source droplet is generated or to determine a size of the generated satellite; and
control a formation of a stream of source droplets based on the determination of whether a satellite of the source droplet is generated or based on the determination of a size of the generated satellite,
wherein the source droplet controller comprises:
a signal analyzer configured to analyze a light signal wave of the detection light to generate a control signal; and
a driving controller configured to provide the control signal to the source droplet generator,
wherein the signal analyzer is configured to analyze a width of the light signal wave to determine a size of the source droplet.

8. The EUV light source device of claim 7, wherein the width of the light signal wave is the full width at half maximum of the light signal wave.

9. An extreme ultraviolet (EUV) light source device, comprising:
a collector configured to collect and reflect extreme ultraviolet (BUY) light;
a source droplet generator configured to generate source droplets and to inject the source droplets to the collector;
a light irradiator configured to direct a detection light to an injection path of the source droplets;
a light detector configured to detect the detection light blocked by a respective source droplet;

a drive laser configured to irradiate the source droplet injected to the collector with a laser light to generate the EUV light; and
a source droplet controller connected to the light detector and the source droplet generator and configured to:
analyze the detection light to determine whether a satellite of the source droplet is generated and, if so, to determine a size of the generated satellite; and
control a formation of a stream of source droplets in response to determining whether a satellite of the source droplet is generated and, if so, in response to determining a size of the generated satellite.

10. The EUV light source device of claim 9, wherein the light detector is configured to generate a light signal wave from a signal of the detection light blocked by the source droplet.

11. The EUV light source device of claim 10, wherein the source droplet controller comprises a signal analyzer that is configured to compare the light signal wave with a reference wave.

12. The EUV light source device of claim 11, wherein the signal analyzer comprises an integrator configured to integrate the light signal wave to provide an integrated value and a differentiator configured to compare the integrated value and a reference value of the reference wave.

13. The EUV light source device of claim 11, wherein the signal analyzer is configured to analyze a width of a detected the light signal wave to determine a size of the source droplet.

14. The EUV light source device of claim 13, wherein the width of the light signal wave is the full width at half maximum of the light signal wave.

15. The EUV light source device of claim 9, wherein the source droplet generator comprises:
a fuel supply configured to supply a liquid fuel;
a nozzle connected to the fuel supply through a fuel supply line and configured to eject source droplets; and
an actuator configured to oscillate the fuel supply line at an oscillatory frequency to form the stream of source droplets ejected from the nozzle.

16. The EUV light source device of claim 9, wherein the source droplet controller is configured to generate a control signal comprising control values with respect to an oscillation frequency, a gain value or an uptime related to forming conditions of the source droplets.

17. The EUV light source device of claim 9, wherein the source droplet comprises at least one element of xenon, lithium and tin.

18. The EUV light source device of claim 9, wherein the collector includes an elliptical reflection surface having a first focus position within or near an irradiation site to which the laser light is focused.

19. The EUV light source device of claim 9, wherein:
the light detector is configured to generate a light signal wave from a signal of the detection light blocked by the source droplet; and
the source droplet controller is configured to compare the light signal wave with a reference wave.

20. The EUV light source device of claim 9, wherein:
the light detector is configured to generate a light signal wave from a signal of the detection light blocked by the source droplet; and
the source droplet controller is configured to analyze a width of the light signal wave to determine a size of the source droplet.

* * * * *